July 19, 1955 P. RAPPAPORT 2,713,644

SELF-POWERED SEMICONDUCTOR DEVICES

Filed June 29, 1954

INVENTOR.
PAUL RAPPAPORT
BY J. C. Whittaker
ATTORNEY

United States Patent Office 2,713,644

Patented July 19, 1955

2,713,644

SELF-POWERED SEMICONDUCTOR DEVICES

Paul Rappaport, Princeton, N. J., assignor to Radio Corporation of America, a corporation of Delaware Application June 29, 1954, Serial No. 440,109

9 Claims. (Cl. 307—88.5)

Figure 1:
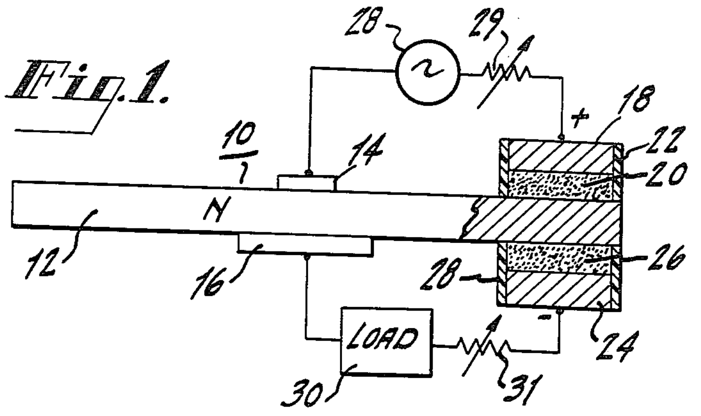

This invention relates to improved semiconductor devices and particularly to an improved device in combination with a novel power source.

The present trend in electronic devices and circuits is toward consolidation and miniaturization, i. e. toward reducing the number and size of circuits and electronic components thereof. With the advent of miniature electron tubes, transistors and printed circuits added impetus was given to this trend with respect to electronic equipment. The advantages of miniaturization are particularly evident when applied to equipment such as portable radios and hearing aids. In addition, miniaturization of electronic equipment is particularly advantageous in military applications. Devices employing transistors have led the way in the trend toward miniaturization.

One type of transistor comprises a body of semiconductor material having two rectifying electrodes in contact therewith. One rectifying electrode is operated as an input or emitter electrode and injects minority charge carriers into the semiconductor body. The minority charge carriers are collected by the other rectifying electrode which is termed the output or collector electrode. A base electrode is in ohmic (non-rectifying) contact with the body or crystal and, by controlling the electrical potential of the crystal, serves to control the emitter-to-collector current flow.

In the operation of the above-described type of transistor, generally, one battery is provided for biasing the emitter electrode in the forward direction with respect to the semiconductor crystal and another battery is provided for biasing the collector electrode in the reverse direction with respect to the semi-conductor crystal. In a circuit, for example, a radio circuit separate batteries may be provided for each transistor or, at the least, a single large battery may be provided for supplying all of the required bias voltages. Thus, the overall size of electronic equipment employing such semiconductor devices depends and, in general, is determined by the number and size of the batteries and their associated supports, sockets or terminals. As a result, this type of equipment is still undesirably cumbersome.

Accordingly, an important object of this invention is to provide a semiconductor device of new and improved form.

A further object of this invention is to provide an improved semiconductor device which promotes the reduction in size of electronic systems and circuits in which such devices are employed.

Still another object of the invention is to provide a self-powered semiconductor device which operates without separate external electrical bias voltage sources.

In general, the purposes and objects of this invention are accomplished in an improved semiconductor device comprising, in combination, a semiconductor crystal and one or more rectifying electrodes, and also including the necessary bias voltage sources formed as an integral part thereof, the semiconductor crystal being a component part of the voltage sources. A first element more positive than the semiconductor crystal in the electrochemical series is coupled to the crystal through a suitable electrolyte mix to provide a first electrochemical cell. Connection to the selected first element which is the anode of the first cell provides a negative bias voltage with respect to the crystal (base) portion of the transistor. Similarly, a second element more negative than germanium in the electrochemical series is coupled to the crystal and through a suitable electrolyte mix to provide a second electrochemical cell. Connection to the second element which is the cathode of the second cell provides a positive bias voltage with respect to the base. Thus the semiconductor device is provided with its own integral sources of power and internal connections are effected between the bias voltage sources and the base portion of the device.

Figure 2:
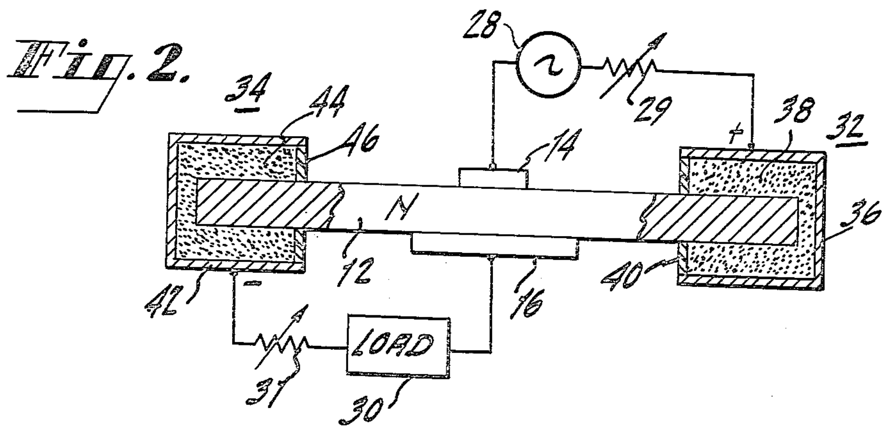

The invention is described in greater detail by reference to the accompanying drawing wherein:

Fig. 1 is an elevational view partly in section of a first device embodying the principles of the invention; and, Fig. 2 is an elevational view partly in section of a second device embodying the principles of the invention.

Similar elements are designated by similar reference characters throughout the drawing.

Referring to Figures 1 and 2, a semiconductor device 10, according to a first embodiment of the invention, comprises a body or crystal 12 of semiconductor material, for example, germanium, silicon or the like of N-type or P-type conductivity. In the following description, the crystal will be assumed to be N-type germanium. The crystal 12 is provided with an emitter or input rectifying electrode 14 and a collector or output rectifying electrode 16. The emitter and collector rectifying electrodes may be grown-junction electrodes or surface barrier electrodes of small area point or line contact type or they may be comparatively large-area surface barrier plates or films or the like. These electrodes may also be P-N junction-type electrodes of the type described in an article by Law, Mueller and Pankove entitled "A Developmental P–N–P Junction Transistor" in the Proceedings of the IRE of November 1952.

When a device 10 of the type shown in Figure 1, is operated in a circuit, for example as an amplifier, the emitter electrode 14 is biased positive and in the forward direction with respect to the N-type germanium crystal 12 while the collector electrode 16 is biased negative and in the reverse direction with respect to the semiconductor crystal. Ordinarily, these biases are provided by means of conventional electrochemical primary cells. However, according to the present invention, the required bias voltage sources are provided as component parts of the semiconductor device.

Since germanium occupies a substantially intermediate position in the electrochemical series, it may be coupled with elements above and below it in the series to provide electrochemical cells. One suitable element which is electro-negative with respect to germanium is copper and one suitable electropositive element is zinc.

Referring again to Figure 1, in one suitable construction, a copper plate 18 is coupled to one surface of the germanium crystal 12 by means of a suitable electrolyte mix, for example, a disk 20 of zinc chloride paste. A suitable plastic or other insulating container 22 is provided for maintaining the germanium and copper electrodes and the electrolyte in the desired spatial relationship. Similarly, a zinc plate 24 is coupled to the opposite surface of the germanium crystal through a disk 26 of the zinc chloride electrolyte and an insulating container member 28 is provided for maintaining the desired spatial relationship with respect to the zinc electrode. Thus, two separate electrochemical cells are provided with the copper plate 18 providing a source of positive bias voltage and the zinc plate 24 providing a source of negative bias voltage, both with respect to the semiconductor crystal.

In operation of the device 10 as an amplifier, the emitter 14 is connected through a signal source 28 and through a variable bias resistor 29 to the copper plate 18 whereby the emitter is biased in the forward direction with respect to the crystal 12. Similarly, the collector 16 is connected through a load circuit 30 and through a variable bias resistor 31 to the zinc plate 24 whereby the collector is properly biased in the reverse direction with respect to the crystal 12.

Referring to Figure 2, in a second embodiment of the invention, electrochemical bias voltage cells 32 and 34 may be provided at opposite ends of the semiconductor crystal 12. In this construction, for example, a copper cup 36 may be employed as the cathode of one cell 32 and one end of the germanium crystal is inserted into the cup along with a quantity of zinc chloride electrolyte 38. A suitable insulating sealing washer 40 is provided for the open end of the copper cup 36 surrounding the crystal 12. Similarly, at the other end of the semi-conductor crystal the other cell 34 is composed of a zinc cup 42 in which the germanium crystal and a quantity of zinc chloride electrolyte 44 are inserted. The zinc cup 42 is also provided with a suitable insulating sealing washer 46. Thus, the cup 36 of the cell 32 provides a positive bias voltage and the cup 42 of the cell 34 provides a negative bias voltage. Circuit connections similar to those for the device of Figure 1 may be made to the device as described immediately heretofore.

It is to be understood that the principles of the invention are applicable to semiconductor devices of all types and having various numbers of electrodes. Furthermore, the combination of semiconductor device and electrochemical cell or cells may take any convenient shape or size. In addition, any suitable electro-positive and electro-negative materials other than zinc and copper may be employed as may other appropriate electrolytes. It is also to be understood that the well-known and necessary components such as electrode spacers, depolarizing means and the like which are generally employed in making electrochemical cells are provided herein wherever necessary.

What is claimed is:

1. A semiconductor device including in combination a body of semiconductor material, rectifying means including a portion of said body and an electrochemical power source for said device in contact with said body and including said body as one electrode element thereof.

2. A semiconductor device including in combination a body of semiconductor material, rectifying means including a portion of said body and an electrochemical cell in contact with said body and including said body as one electrode element thereof.

3. A semiconductor device including in combination a body of semiconductor material, rectifying means including a portion of said body and an electrochemical cell in contact with said body, said cell including a portion of said body as one electrode element thereof and an electrolyte and a body of material occupying a different position in the electrochemical series than said semiconductor material.

4. A semiconductor device including in combination a body of semiconductor material, rectifying means including a portion of said body and an electrochemical power source in contact with said body and including said body as one electrode element thereof, said power source also including a body of material more positive than said semiconductor material in the electrochemical series and a body of material more negative than said semiconductor material in the electrochemical series.

5. A semiconductor device including in combination a body of semiconductor material, rectifying means including a portion of said body and a power source including said body as one electrode element thereof, said power source comprising a first electrochemical cell including a portion of said body, a first element of a material more positive than said body in the electrochemical series and an electrolyte, and a second electrochemical cell including a portion of said body, a second element more negative than said body in the electrochemical series and an electrolyte.

6. A semiconductor device including in combination a body of semiconductor material, a rectifying electrode in contact with said body and an electrochemical power source including said body as one electrode element thereof.

7. A semiconductor device including a body of semiconductor material, a rectifying electrode in contact with said body and an electrochemical power source including said body as one electrode element thereof, and means connecting said power source to said rectifying electrode.

8. A semiconductor device including a body of semiconductor material, a rectifying electrode in contact with said body, and an electrochemical cell including said body as one electrode element thereof, said cell including an electrolyte and a body of material occupying a different position in the electrochemical series than said semiconductor material, and means connecting said cell to said electrode.

9. A semiconductor device including a body of semiconductor material, a pair of rectifying electrodes in contact with said body, and a power source including said body as one electrode element thereof, said power source comprising a first electrochemical cell including a portion of said body, a first element of a material more positive than said body in the electrochemical series and an electrolyte, and a second electrochemical cell including a portion of said body, a second element more negative than said body in the electrochemical series and an electrolyte, and means connecting said power source to said pair of rectifying electrodes.

References Cited in the file of this patent

FOREIGN PATENTS 508 of 1883 Great Britain ---------- Jan. 30, 1883